Aug. 21, 1962 H. STUMP 3,050,666

YIELDABLE ELECTRODE FOR SEMICONDUCTOR DEVICES

Filed Nov. 2, 1960

INVENTOR.
HARVEY STUMP
BY Lilly & Nyhagen
Attorneys

United States Patent Office 3,050,666

Patented Aug. 21, 1962

3,050,666

YIELDABLE ELECTRODE FOR SEMICONDUCTOR DEVICES

Harvey Stump, Canoga Park, Calif., assignor to Diodes Incorporated, Los Angeles, Calif., a corporation of California Filed Nov. 2, 1960, Ser. No. 66,715
5 Claims. (Cl. 317—234)

This invention deals generally with semiconductor devices and, particularly, with an improved yieldable electrode configuration for crystal-type semiconductor devices, such as crystal diodes and transistors.

This application is a continuation-in-part of my copending application Serial No. 852,726 filed November 13, 1959, entitled Yieldable Electrode for Semiconductor Devices, and now abandoned.

Semiconductor devices of the type with which this invention is concerned are well known in the art and comprise, briefly, a wafer or crystal of semiconductor material enclosed in an outer case and two or more electrodes in electrical contact with the crystal.

Maximum life of a semiconductor device of this type can be attained only if it is hermetically sealed. This requires that the electrodes be hermetically sealed through the case and that the latter be made of a material which is capable of affording a highly efficient hermetic enclosure for the crystal while withstanding the relatively high operating temperature of a semiconductor device. Glass and certain ceramic materials are ideally suited for this use.

These latter materials, while capable of affording an efficient hermetic enclosure and withstanding the high operating temperatures, have relatively low coefficients of thermal conductivity. This creates a problem of heat dissipation. That is to say, because of the low thermal conductivity of the case, a large portion of the heat generated in the semiconductor device during operation must be dissipated through the electrodes. Moreover, the demand is for a semiconductor device having a minimum size and a maximum current capacity. A reduction in the size of the semiconductor device, of course, results in a reduction of the cross-sectional area of the electrodes through which heat can be dissipated. Increased current flow through the device results in an increase in the heat generated. Accordingly, the smaller the size of the semiconductor device, the more efficient must be the heat dissipation through the electrodes if the device is to have a high current capacity. This requires that the electrodes be bonded directly to the crystal, so as to attain maximum heat transfer from the crystal to the electrodes. Further, the electrodes must be made of a material having a high coefficient of thermal conductivity. Silver, gold and aluminum are such materials.

Making the case of a hermetically sealed semiconductor device of glass or ceramic material and the electrodes of any one of the metals mentioned above, however, creates an additional problem. That is to say, the semiconductor device must be heated to a relatively high temperature during manufacture to effect bonding of the electrodes to the crystal and sealing of the electrodes through the case. Moreover, glass and ceramic material have relatively low coefficients of thermal expansion while silver and the other mentioned electrode metals have a relatively high coefficient of thermal expansion. As a result, during cooling of the device after heating in the course of its manufacture, the case of the device contracts only a slight amount while the electrodes undergo substantial contraction. During periodic operation of a semiconductor device, the electrodes also undergo thermal expansion and contraction with respect to the case.

Now it will be obvious that since the electrodes are sealed through the case at one point and bonded to the crystal at another point, contraction of the electrodes with respect to the case during cooling of the semiconductor device creates tensile forces in the electrodes which tend to shear the seals between the electrodes and case and rupture the bonds between the electrodes and crystal. The electrode-case seals can be made sufficiently strong to withstand these tensile forces. The electrode-crystal bonds, however, are prone to damage or complete rupture by the tensile forces.

This invention provides a unique yieldable electrode configuration which is designed to yield elastically and plastically under the tensile forces created in the electrodes during cooling before damage to or rupture of the electrode-crystal bonds can occur. Numerous yieldable electrode configurations have, of course, been devised for semiconductor devices. One such electrode configuration is the well-known S-shaped electrode.

These existing yieldable electrode configurations, however, have certain inherent deficiencies which are not present in the yieldable electrode configuration of this invention.

First, the existing yieldable electrodes have a relatively small cross-sectional area. As a result, these electrodes possess low current-carrying capacity and poor heat dissipation characteristics. Second, because of the way in which these electrodes yield or flex, they must be constructed of a spring metal, rather than some other, perhaps less elastic material, such as silver, gold or aluminum, having superior current-carrying and heat dissipation properties. These deficiencies obviously greatly restrict the power rating of the existing semiconductor devices which employ the existing yieldable electrode designs.

With the foregoing preliminary discussion in mind, a general object of the present invention is to provide an improved yieldable electrode configuration for semiconductor devices.

Another object of the invention is to provide an improved yieldable electrode configuration for semiconductor devices which is designed to yield by undergoing initial elastic deformation and subsequent plastic flow.

Yet another object of the invention is to provide an improved yieldable electrode configuration for semiconductor devices which possesses an appreciably greater effective cross-sectional area, and hence greater current-carrying and heat dissipation capabilities than the existing yieldable electrode configurations.

A further object of the invention is to provide an improved yieldable electrode configuration for semiconductor devices which permits the electrode to be made of a relatively soft metal, such as silver, gold or aluminum, having greater current-carrying and heat dissipation capabilities than the spring metals employed in the existing yieldable electrode designs.

A still further object of the invention is to provide an improved yieldable electrode for semiconductor devices which is extremely simple in design, easily fabricated, and results in a simplified, less costly semiconductor device.

Other objects, advantages and features of the invention will become readily apparent from the following detailed description thereof taken in connection with the annexed drawing, wherein.

Figure 1:
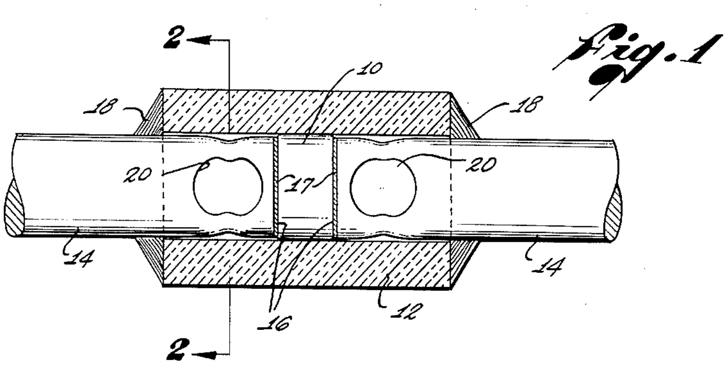
FIG. 1 is a longitudinal section through a crystal diode embodying the yieldable electrode configuration of this invention.
Figure 2:
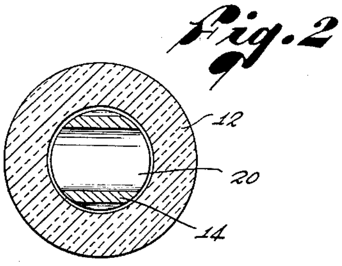
FIG. 2 is a section taken on line 2—2 of FIG. 1.

The crystal diode illustrated in FIGS. 1 and 2 comprises, in the usual way, a wafer or crystal 10 of semiconductor material enclosed within an outer ceramic or glass case or sleeve 12. The two electrodes 14 of the diode are inserted into the opposite ends of the sleeve 12 and have their inner end faces 16 bonded at 17 to the opposite faces of the crystal 10. Each electrode is firmly sealed to the adjacent end of the sleeve 12 by a suitable sealing material 18 so that the diode is hermetically sealed. Electrodes 14 are made of silver, gold, aluminum, or other metal having a comparable high coefficient of thermal conductivity and a low elastic limit.

As mentioned earlier, and as will be evident from FIG. 1, the electrodes 14 are rigidly joined to the ends of the sleeve 12 by the seals 18 and are joined at their inner ends to the crystal 10 by the bonds 17. Also as explained earlier, the ceramic or glass sleeve 12 has a relatively low coefficient of thermal expansion while the electrodes 14 have a relatively high coefficient to thermal expansion. Accordingly, during cooling of the diode after heating in manufacture or subsequent operation, the electrodes undergo contraction with respect to the sleeve. It is obvious that this relative contraction of the electrodes creates tension forces in the latter which tend to pull them through the seals 18 and also tends to rupture the electrode-crystal bonds 17. Seals 18 obviously can be made sufficiently strong to resist these tensile forces in the electrodes. The electrode-crystal bonds 17, however, are relatively weak and, therefore, prone to damage or complete rupture under the action of the tensile forces created in the electrodes during cooling.

Such damage or rupture of the bonds 17 is prevented by the electrode holes 20. As explained below, these holes afford the electrodes with the ability to yield elastically and plastically under the action of tensile forces in the electrodes which are appreciably below those which would cause damage to or rupture of the crystal bonds 17. This elastic and plastic yielding action will now be described by reference to FIG. 4.

In this figure, it will be observed that the portions or legs L of the electrode 14 between plane X, passing through the center of hole 20 in the electrode and planes Y and Z, tangent to the right- and left-hand edges of the hole, respectively, form, in effect, columns which are stressed in tension by the tensile force acting on the electrode during cooling, as just discussed. It will be seen, however, that each such column-like leg is not symmetrical. As a result, the neutral axes A of the legs curve inwardly toward the axis of the electrode, as shown.

Accordingly, it is obvious that when the legs L are stressed in tension, each leg is subjected to a resultant bending force, diagrammatically indicated at *f*, which tends to pull in the narrow end of the respective leg toward the axis of the electrode. In other words, each leg bends in the manner of a beam which is fixed at one end, i.e., the wide end of the respective leg. As a result, when the electrodes 14 of the semiconductor device contract during cooling, they assume the shape shown in FIG. 1 and in phantom lines in FIG. 4.

During this inward bending of the legs L, the metal of the legs which is located outwardly of neutral axes A is subjected to a tensile bending stress. This latter metal, then, is subjected to the tensile stress created in the legs by the tensile force on the electrode and to the additional tensile bending stress created by inward bending of the legs.

Increasing the diameter of the hole 20, of course, decreases the cross-sectional dimensions of the electrode legs L and thereby increases the tensile stress per unit area on the legs. I have found that if the hole 20 is properly proportioned with respect to the diameter of the electrode, the electrode legs L will initially yield elastically to a point where the tensile stress per unit area acting on the metal of the electrode legs, outwardly of the neutral axes A, reaches the relatively low elastic limit of the metal, whereupon plastic flow or deformation will occur in these areas of the electrode, at a total tensile force on the electrode which is well below that necessary to damage or rupture the electrode-crystal bonds 17.

Figure 4:
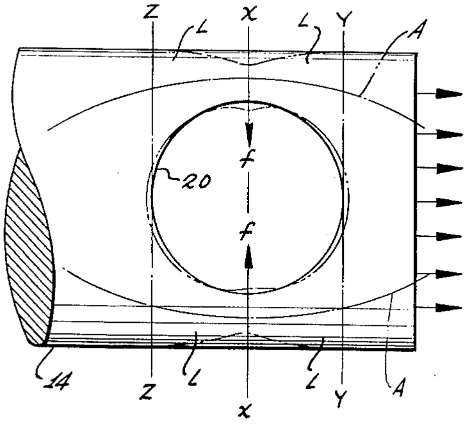
FIG. 4 is an enlargement of the inner end of the present electrode illustrating the manner in which it yields under tension.

After electrode legs L have elastically and plastically deformed or bent inwardly to a position of equilibrium, approximately that shown in phantom lines in FIG. 4, the metal in the narrow portions of the legs, i.e., at plane X, yields elastically until the stress per unit area in these portions reaches the elastic limit of the metal whereupon plastic flow or stretching commences in these areas. If the hole is properly proportioned, this elastic and plastic deformation will occur at a total tensile force on the electrode which is well below that which would cause damage to the electrode-crystal bonds 17.

Simply stated, then, the invention involves the formation of a hole in the electrode of such a diameter that the cross-sectional area of the legs at opposite sides of the hole is reduced to a value whereat the combined bending and tensile stresses per unit area acting on the metal in these areas reaches the elastic limit of the metal at some total tensile force on the electrode less than that required to damage or rupture the electrode-crystal bonds.

The effective cross-sectional area of the present electrode, even at its minimum section in plane X, and therefore, its heat dissipation capacity are appreciably greater than those of existing yieldable electrode configurations. Since the elastic properties of the electrode are not the only properties utilized, the electrode metals mentioned earlier can be used. This, in turn, means that the present diode has an appreciably greater current capacity than existing diodes of comparable size. By way of example, a diode constructed in accordance with this invention, having an overall diameter of .105 inch and length of .200 inch, an electrode diameter of .040 inch, and an electrode hole diameter of .025 inch, has a current-carrying capacity of one ampere as compared with a current-carrying capacity of a few milliamps for existing diodes of comparable size.

Figure 3:
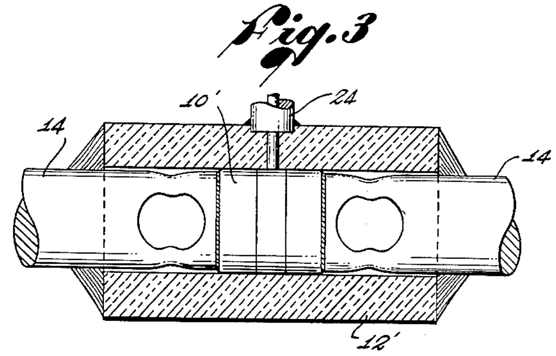
FIG. 3 illustrates the present electrode in a transistor.

It is evident that the hole in the electrode need not be circular in shape but could, for example, be elliptical, triangular, diamond shaped, or of any other configuration which will give rise to bending or flexing of the electrode columns under a tension load on the electrode in the manner described above. It is also obvious that the present electrode is not limited to use in crystal diodes. For example, it may be employed in transistors, as illustrated in FIG. 3, wherein the semiconductor crystal 10′ is contacted by a base electrode 24, extending through a side of its case or sleeve 12′, in addition to the present yieldable electrodes 14, which provide, in this case, an emitter and a collector, respectively. The electrode may otherwise be used to advantage in any other type of semiconductor device in which the electrodes must possess a degree of axial yieldability.

It is clear, therefore, that there has been described and illustrated an electrode for a semiconductor device which is fully capable of attaining the several objects and advantages preliminarily set forth.

What is claimed is:

1. A semiconductor device comprising an outer hermetic sleeve, a semiconductor crystal within the sleeve, a pair of metal electrodes extending into opposite ends of the sleeve, means bonding the inner ends of the electrodes to the crystal, means hermetically sealing the ends of the sleeve to the adjacent portions of the electrodes whereby to form a hermetic enclosure for the crystal, at least one electrode having a transverse hole extending therethrough, said hole being at a point between said inner end and said adjacent portion of said one electrode, said electrodes having a higher coefficient of thermal expansion than said sleeve whereby during cooling of the semiconductor device after heating thereof, the electrodes contract with respect to the sleeve and tensile forces are created in the electrodes tending to rupture the bonds between the electrodes and crystal, the portions of said one electrode at opposite sides of said hole comprising relatively slender, column-like legs which are stressed in tension by said tensile forces in the electrodes, and said hole being so proportioned with respect to the diameter of said one electrode that the stress per unit area in said legs exceeds the elastic limit of the metal of the electrodes at a tensile force value in the electrodes which is less than that necessary to rupture said bonds between the crystal and electrodes.

2. A semiconductor device comprising an outer hermetic sleeve, a semiconductor crystal within the sleeve, a pair of metal electrodes extending into opposite ends of the sleeve, means bonding the inner ends of the electrodes to the crystal, means hermetically sealing the ends of the sleeve to the adjacent portions of the electrodes whereby to form a hermetic enclosure for the crystal, each electrode having a transverse hole extending therethrough, said hole being at a point between said inner end and said adjacent portion of the respective electrode, said electrodes having a higher coefficient of thermal expansion than said sleeve whereby during cooling of the semiconductor device after heating thereof, the electrodes contract with respect to the sleeve and tensile forces are created in the electrodes tending to rupture the bonds between the electrodes and crystal, the portions of said electrodes at opposite sides of said holes in the respective electrodes comprising relatively slender, column-like legs which are stressed in tension by said tensile forces in the electrodes, and said holes being so proportioned with respect to the diameter of said electrodes that the stress per unit area in said legs exceeds the elastic limit of the metal of the electrodes at a tensile force value in the electrodes which is less than that necessary to rupture said bonds between the crystal and electrodes.

3. The subject matter of claim 1 wherein said hole is circular.

4. The subject matter of claim 1 wherein said sleeve comprises a ceramic material and said electrodes comprise metal silver.

5. A semiconductor device comprising an outer ceramic sleeve, a semiconductor crystal within the sleeve, a pair of metal silver electrodes extending into opposite ends of the sleeve, means bonding the inner ends of the electrodes to the crystal, means hermetically sealing the ends of the sleeve to the adjacent portions of the electrodes whereby to form a hermetic enclosure for the crystal, each electrode having a transverse hole extending therethrough, said hole being at a point between said inner end and said adjacent portion of the respective electrode, said electrodes having a higher coefficient of thermal expansion than said sleeve whereby during cooling of the semiconductor device after heating thereof, the electrodes contract with respect to the sleeve and tensile forces are created in the electrodes tending to rupture the bonds between the electrodes and crystal, the portions of said electrodes at opposite sides of said holes in the respective electrodes comprising relatively slender, column-like legs having neutral axes which bend inwardly toward the central axis of the electrodes at opposite sides of a transverse plane of each electrode passing through the center of the hole in the respective electrode, said legs being stressed in tension by said tensile forces in the electrodes and said legs bending inwardly toward said central axis in the vicinity of said plane under the action of said tensile force on the electrodes, whereby said legs are subjected to a combined tensile and bending stress, and said holes being so proportioned with respect to the diameter of said electrodes that the combined tensile and bending stress per unit area in said legs exceeds the elastic limit of the metal of the electrodes at a tensile force value in the electrodes which is less than that necessary to rupture said bonds between the crystal and electrodes.

References Cited in the file of this patent

UNITED STATES PATENTS 2,896,134 Myer ________________ July 21, 1959

UNITED STATES PATENT OFFICE
CERTIFICATE OF CORRECTION

Patent No. 3,050,666 August 21, 1962

Harvey Stump

It is hereby certified that error appears in the above numbered patent requiring correction and that the said Letters Patent should read as corrected below.

In the grant, lines 2 and 3, for "assignor to Diodes Incorporated, of Los Angeles, California, a corporation of California" read -- assignor to Diodes Incorporated, of Canoga Park, California, a corporation of California --; in the heading to the printed specification, lines 4 to 6, for "assignor to Diodes Incorporated, Los Angeles, Calif., a corporation of California" read -- assignor to Diodes Incorporated, Canoga Park, Calif., a corporation of California --.

Signed and sealed this 1st day of January 1963.

(SEAL)
Attest:

ERNEST W. SWIDER
Attesting Officer

DAVID L. LADD
Commissioner of Patents